United States Patent [19]

Olmer et al.

[11] Patent Number: 4,489,102

[45] Date of Patent: Dec. 18, 1984

[54] RADIATION-STIMULATED DEPOSITION OF ALUMINUM

[75] Inventors: Leonard J. Olmer, Hopewell Township, Mercer County; Daniel J. Shanefield, Princeton Township, Mercer County, both of N.J.

[73] Assignee: AT&T Technologies, Inc., New York, N.Y.

[21] Appl. No.: 482,078

[22] Filed: Apr. 4, 1983

[51] Int. Cl.³ .............................................. C23C 17/00
[52] U.S. Cl. ............................. 427/54.1; 204/157.1 R
[58] Field of Search ................ 427/54.1; 204/157.1 R

[56] References Cited

U.S. PATENT DOCUMENTS

| Re. 27,606 | 4/1973 | Schmidt et al. ................... 427/252 |
|---|---|---|
| 3,271,180 | 9/1966 | White . |
| 3,364,087 | 1/1968 | Solomon et al. . |
| 3,375,129 | 3/1968 | Carley et al. ...................... 427/252 |
| 3,386,823 | 6/1968 | Keller et al. . |
| 3,462,288 | 8/1969 | Schmidt et al. ...................... 427/35 |
| 4,006,269 | 2/1977 | Kerfoot . |
| 4,324,854 | 4/1982 | Beauchamp et al. . |

OTHER PUBLICATIONS

*Physics Today* Oct. 1980, pp. 21,22.
Ehrlich et al. *IEEE Journal of Quantum Electronics* vol. QE-16 No. 11, Nov. 1980, pp. 1233–1243.

*Primary Examiner*—John H. Newsome
*Attorney, Agent, or Firm*—J. F. Spivak

[57] ABSTRACT

A method for depositing aluminum films on a substrate comprises exposing the substrate to vapors of an aluminum hydride-trialkylamine complex and exposing the surface to ultraviolet light in the areas where aluminum deposition is desired.

8 Claims, 2 Drawing Figures

RADIATION-STIMULATED DEPOSITION OF ALUMINUM

TECHNICAL FIELD

This invention relates to plating of aluminum on substrates by radiation-stimulated decomposition of a complex aluminum compound and to products made therefrom.

BACKGROUND OF THE INVENTION

Aluminum is a very desirable coating material, particularly for oxidizable metals. The surface of aluminum exposed to air rapidly develops an oxide film that protects the remainder of the aluminum from oxidation. Hence, aluminum films may be used to protect the substrate material from oxidation.

In addition to its use as a protective coating, aluminum is also suitable as a conductor in thin film electrical circuits and as a conductor and/or dopant in semiconductor devices such as Josephson junction devices and gallium arsenide or other III-V type semiconductor devices.

Aluminum films are typically formed by means of vacuum evaporation or sputtering, both of which require relatively high vacuums. In addition, substrate heating is also often needed. When operating at elevated temperatures, detrimental effects may occur to the substrate especially when dealing with semiconductors such as gallium arsenide. This problem is especially apparent when the method of deposition involves thermal decomposition of organo-aluminum compounds. Furthermore, where extremely fine line deposition of the aluminum may be required, thermal decomposition techniques require the use of a laser or other concentrated heat source which must be scanned in the desired pattern to be produced and its energy must be adjusted such that the underlying substrate is not damaged by the laser. This can be a difficult task. Alternatively when forming patterns by means of vacuum evaporation or sputtering, contact masks, e.g., photoresists, must be applied to the substrate surface.

U.S. Pat. No. 3,271,180, issued to P. White describes a radiation-stimulated process for forming metal deposits of tin, lead, germanium, silicon, cadmium and the like by u.v. stimulated decomposition of the metal-alkyl complexes such as the metal tetramethyl or tetraethyl complexes. In accordance with this method, decomposition of the compounds by radiation occurs at temperatures between 200° C. and 300° C. as compared to thermal decomposition of the same materials which takes place at about 600° C. Similar processes were described by D. J. Ehrlich et al. in an article appearing in the IEEE, *Journal of Quantum Electronics*, Vol. QE-16, No. 11, Nov. 1980 wherein laser photodeposition was employed to deposit metal films from metal-alkyl compounds. Here, the use of trimethyl aluminum was specifically set forth. However, the rate of aluminum deposition was reported as being extremely slow.

In U.S. Pat. No. 3,375,129, there is described a thermal decomposition method for the formation of aluminum films employing thermally decomposable vapors of an amine complex of aluminum hydride. These are the same compounds employed by applicants herein for photodecomposition. It is taught therein that it is preferred to employ an amine complex of the plating agent which contains, as the amine constitutent thereof, a tertiary alkylamine having from 1 to 6 carbon atoms. These are said to be preferred since they pyrolize smoothly and cleanly to leave a deposit having a high degree of purity. Trimethylamine and bistrimethylamine complexes of aluminum hydride are said to be especially preferred because of their volatility and stability. In processing such trialkylamine complexes of aluminum hydride it is stated that best results are obtained with temperatures in the range of about 120° C. to about 250° C. As previously stated, it is difficult to employ a thermal technique for the deposition of aluminum where fine patterns are desired since it is difficult to confine the heat to the area required for the pattern. Photostimulated deposition, however, allows one to operate through a non-contact photomask or direct focusing technique mask that the stimulating radiation strikes only the areas in which pattern formulation is desired.

It should be noted that while a given compound may be known to be useful for the production of a metal by thermal decomposition, it is not necessarily suitable for the production of that metal by u.v. stimulated decomposition.

SUMMARY OF THE INVENTION

A method for depositing thin aluminum films on a substrate comprises the step of photodecomposing an aluminum hydride-trialkylamine complex with ultraviolet light.

The aluminum film can be formed in patterns by exposing the substrate having the aluminum hydride-alkylamine adsorbed on its surface, to ultraviolet light through a photomask.

The method is generally useful for the formation of decorative or mirrored surfaces, for the formation of protective layers as well as the formation of circuit patterns or conductive layers on semiconductor devices and for the selected application of an aluminum doping material to be diffused into a semiconductor device.

DETAILED DESCRIPTION

Relatively rapid ultraviolet stimulated deposition of thin aluminum films on cold substrates has been demonstrated. The method involves the adsorption of aluminum hydride-trialkylamine onto the surface of the substrate followed by the decomposition of the hydride amine complex upon exposure to ultraviolet light. The preferred complex is aluminum hydride-trimethylamine. However, other low molecular weight trialkylamines having substantial vapor pressure at room temperature such as triethyl and tripropylamine should also be useful. The deposition rate of the aluminum films depends upon the intensity of the ultraviolet light employed. For example, the deposition rate using a focused 100 Watt mercury-arc lamp was 50A. per minute. However, the rate increased significantly with increasing u.v. intensity attained by using a higher wattage mercury-arc lamp or a u.v. laser. It should be understood, that while photodeposition employing ultraviolet light to provide the energy to break the bonds necessary to form the aluminum film is preferred in many applications because of the relatively low cost and capital equipment required, one can use other radiation stimulation such as electron beams or ion beams to serve the same function. An important aspect of this invention is the fact that the deposition can be carried out at low temperatures, including room temperature. Hence, there is no need to heat the substrate as in thermal decomposition. This aspect can be quite important in processing semiconductor devices which require aluminum films thereon, since such devices may be adversely affected by the heat required for thermal decomposition. Consequently, the photodeposition as described herein could be applied towards fabricating multilayer integrated circuits, ohmic and Schottky contacts to III-V and II-VI compounds and deposition on any substrate which cannot withstand high temperatures. Other applications include mask repair and fine lines for diffraction grating integrated optics and Josephson junction devices.

Figure 1:
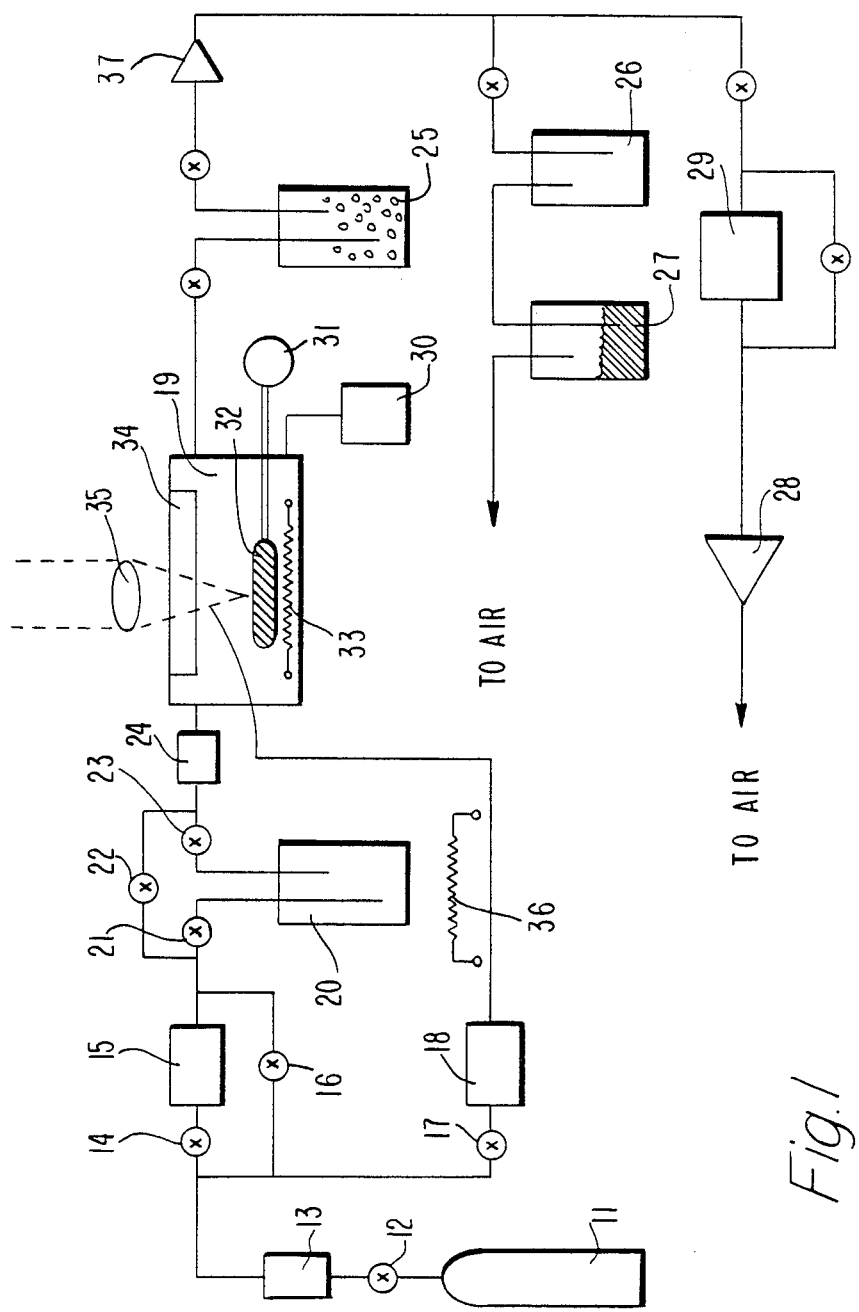
FIG. 1 is a schematic diagram of the reactor system employed for the formation of Al films on a substrate by u.v. radiation induced decomposition of $AlH_3$-$N(R)_3$ complex.

A schematic drawing of the photochemical reactor system for film formation is shown in FIG. 1. In accordance with the schematic, a pressurized carrier gas tank 11 is controlled by a valve 12. The carrier gas from the tank flows through a filter 13. Thereafter, the carrier gas may flow in any one or combination of three paths. The first path passes through control valve 14 and thence through a mass flow meter 15. The second path passes through a valve 16 to meet with the output from the mass flow meter 15. In the third path, the gas flows through a valve 17 and thence through a second mass flow meter 18 and directly into a reaction chamber 19. The gas which flows through the aforementioned first and second paths may be directed through a bubbler trap 20 or may bypass the bubbler trap 20 depending upon the settings of valves 21, 22 and 23. Thereafter, the gas flows through a second filter 24 and thence into the reaction chamber 19. Any unreacted gases and the volatile decomposition products of the reaction then pass out of the reaction chamber 19 through a cold trap 25, pass through a check valve 26 and then may pass through a set of bubblers 26 and 27 before being exposed to the atmosphere. Also, coupled to the check valve is a vacuum pump 28 and servo motor 29 which is used to initially evacuate the system. The reaction chamber 19 contains pressure gauges 30, a thermocouple 31, a substrate holder 32, and a heater 33. The top portion of the reaction chamber 19 has a quartz window 34 which allows ultraviolet light which is focused onto the substrate through a lens 35 to pass therethrough.

In operation of the device, crystals of aluminum hydride-trimethlyamine complex are first placed within the bubbler 20. Its vapor pressure can be varied by means of heater 36 associated with the bubbler 20. The vapors of the AlH$_3$-TMA are transported into the reaction chamber 19 by an argon or nitrogen carrier gas emanating from the carrier gas container 11 and which passes through filter 13 and flow meter 15 into the bubbler 20 picking up the AlH$_3$-TMA vapors and thence passing through filter 24 and into the reaction chamber 19. The flow rates are controlled by the mass flow controller 15. Ultraviolet light is focused by means of lens 35 through the quartz window 34 and onto the substrate 32 contained within the reaction chamber 19. The substrate is placed on an aluminum block within the deposition chamber which block can be heated, if desired. The apparatus is configured such that the exhaust vapors are condensed in the cold trap 25. The pressure within the deposition chamber is measured by the capacitance gauge 30. This type of gauge measures gas pressure independent of the type of gas. A thermocouple gauge may additionally be provided to make sure the system is leak-tight.

When depositing under low pressure, the system is first evacuated and carrier gas fed directly into the system bypassing the bubbler until the desired pressure is reached. Then, during deposition, the exhaust is diverted through the vacuum pump 28 to keep the chamber under constant low pressure. The pumping rate is varied by the servo motor which is in electrical communication with the capacitance pressure gauge 30.

When depositing at atmospheric pressure, the exhaust is first diverted through an empty bubbler 26 and then through a mineral oil filled bubbler 27 to prevent backflow of air into the system.

Ultraviolet radiation is typically supplied by a high pressure mercury xenon lamp. Alternatively one may use a frequency quadrupled raman shifted yttrium aluminum garnet laser or any other applicable u.v. source. Typical u.v. power at the surface of the substrate of the focused light from a 100 Watt mercury source 50 cm distant from the substrate at a wavelength of 240 nm is 4 W/cm$^2$. When using a 1000 Watt mercury-xenon collimated source focused on the substrate from 50 cm. at 240 nm, 140 W/cm$^2$ was achieved. The Yag laser gave powers of 0.6 mW/cm$^2$ and 4.0 mW/cm$^2$ at 199 nm and 239.5 nm, respectively.

When using mercury lamps, infrared heating effects which could lead to undesirable thermodeposition of the aluminum may be supressed by incorporating a water filter in the light path to absorb the infrared radiation.

Figure 2:
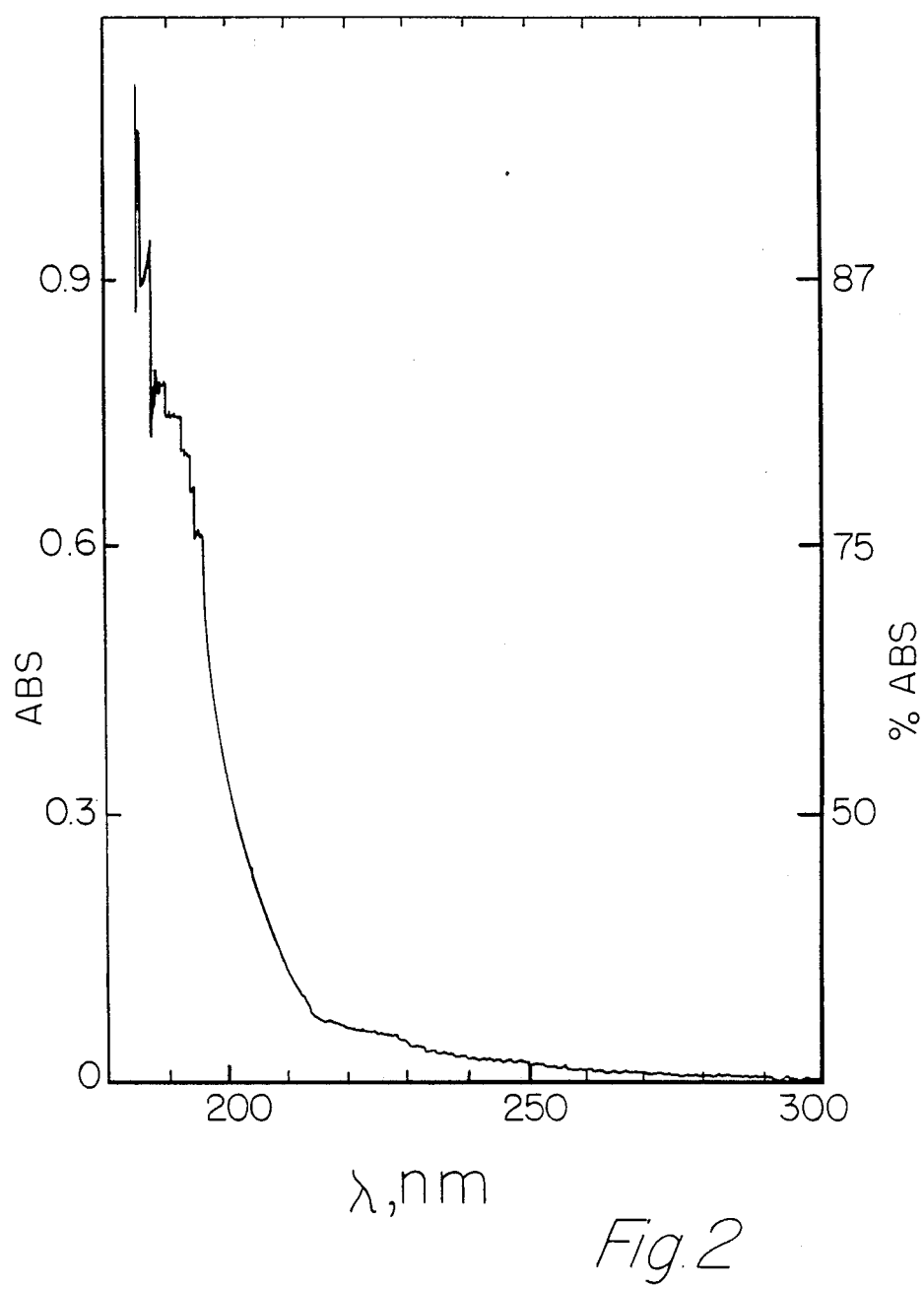
FIG. 2 is a plot of the u.v. absorption spectrum of $AlH_3$-$N(CH_3)_3$.

When the aluminum film was deposited onto an n/n+—Si substrate (n=0.2×10$^{15}$, n+=1×10$^{18}$ atoms/cm$^3$) a Schottky barrier contact was formed. When evaporated onto n+ silicon, an ohmic contact is formed. Consequently, the method of deposition can be employed to make Schottky barrier devices. FIG. 2 shows the gas phase absorption spectra of aluminium hydride-trimethylamine complex. In accordance with this spectra, ultraviolet light of less than 210 nm is required and preferably the u.v. light should be in the range of between 190 and 200 nm.

It is to be understood that the above-described embodiments are simply illustrative of the principles of the invention. Various other modifications and changes may be devised by those skilled in the art which will embody the principles of the invention and fall within the spirit and scope thereof.

What is claimed is:

1. A method for depositing aluminum films on a non-catalyzed substrate comprises exposing the substrate to vapors of a composition consisting of an aluminum hydride-trialkylamine complex and exposing the surface to ultraviolet light in the areas where aluminum deposition is desired.

2. The method recited in claim 1, wherein the trialkylamine is trimethylamine.

3. The method recited in claim 1, wherein an aluminum pattern is formed by passing the u.v. light through a photomask.

4. The method recited in claim 1, wherein an aluminum pattern is formed by focusing the u.v. light on specified predetermined areas of the substrate.

5. The method recited in claim 4, wherein the light source is a u.v. laser.

6. The method recited in claim 3 wherein the u.v. light source is a mercury-arc lamp.

7. The method recited in claim 1, wherein deposition takes place at essentially atmospheric pressure.

8. The method recited in claim 1, wherein deposition takes place at reduced pressures.

* * * * *